(12) United States Patent  
Brown et al.

(10) Patent No.: US 7,063,883 B2
(45) Date of Patent: Jun. 20, 2006

(54) LAMINATE FOR PRINTED CIRCUIT BOARDS

(75) Inventors: Neil Brown, Bergheim (DE); Michael Aggleton, Gloucester (GB)

(73) Assignee: Albemarle Corporation, Richmond, VA (US)

( * ) Notice: Subject to any disclaimer, the term of this patent is extended or adjusted under 35 U.S.C. 154(b) by 677 days.

(21) Appl. No.: 10/279,983

(22) Filed: Oct. 25, 2002

(65) Prior Publication Data

US 2003/0059367 A1 Mar. 27, 2003

Related U.S. Application Data

(62) Division of application No. 09/341,629, filed as application No. PCT/EP98/00211 on Jan. 15, 1998, now Pat. No. 6,514,477.

(30) Foreign Application Priority Data

Jan. 15, 1997 (GB) .................................. 9700708

(51) Int. Cl.
*B32B 5/00* (2006.01)
*B32B 27/00* (2006.01)
*B32B 17/00* (2006.01)

(52) U.S. Cl. ...................... 428/209; 428/328; 428/329; 156/307.4; 442/60; 442/65; 442/70; 442/172; 442/175; 442/180

(58) Field of Classification Search ................ 428/209, 428/328, 329; 156/307.4; 442/60, 65, 70, 442/172, 175, 180

See application file for complete search history.

(56) References Cited

U.S. PATENT DOCUMENTS 5,264,065 A * 11/1993 Kohm ..................... 156/307.4
6,280,839 B1 * 8/2001 Brown et al. ............... 428/328

FOREIGN PATENT DOCUMENTS

| EP | 0118031 | 9/1984 |
| JP | 51027898 | 9/1975 |
| JP | 60203438 | 10/1985 |
| JP | 04243185 | 9/1992 |

OTHER PUBLICATIONS

Misra, C., "Industrial Alumina Chemicals", ACS Monograph 184, (1986).
Amer. Chem. Soc., Washington, D.C.
Patent Abstracts of Japan, vol. 17, No. 13, (E-1304), (Jan. 11, 1993).
Derwent Publications Ltd., Database WPI, Section Ch, Week 8547, AN 85-293904.
Derwent Publications Ltd., Database WPI, Section Ch, Week 7640, AN 76-74517X.

* cited by examiner

*Primary Examiner*—Steven Bos
(74) *Attorney, Agent, or Firm*—Jeremy J. Kliebert

(57) ABSTRACT

Laminates for printed circuit boards having surface layers of curable resin impregnated woven glass fabric and intermediate layers of curable resin impregnated non-woven glass. The intermediate layers contain 200 percent by weight to 275 percent by weight, based on the resin in the intermediate layers, of a thermally stable aluminum hydroxide of the molecular formula $Al_2O_3 \cdot nH_2O$, wherein n has a value of $2.6 < n < 2.9$. The aluminum hydroxide has a specific surface area, measured by the BET method, of 2 to 10 $m^2/g$ and a particle size in the D50% range of 5 to 10 $\mu m$.

11 Claims, 2 Drawing Sheets

LAMINATE FOR PRINTED CIRCUIT BOARDS

Figure 1:
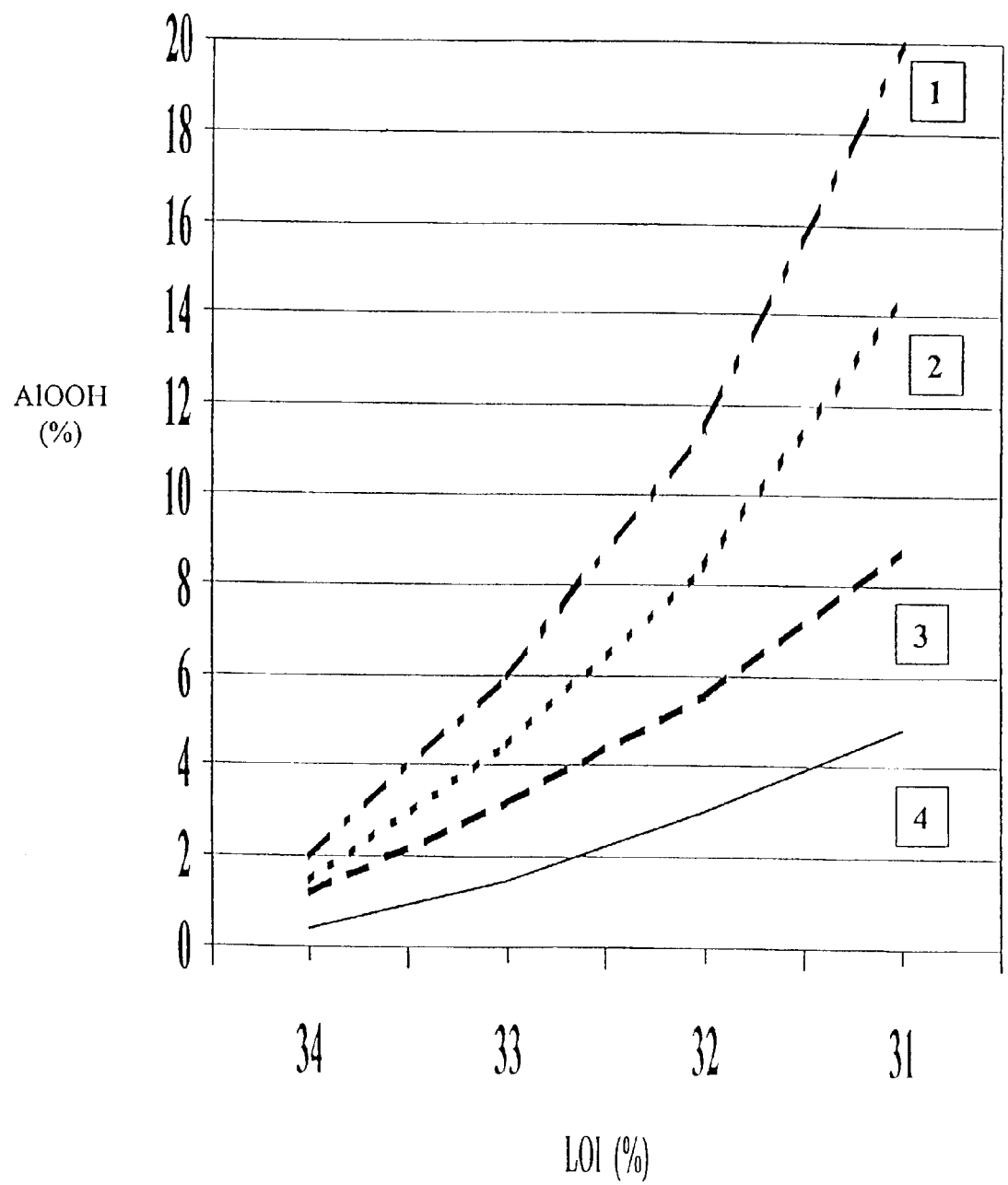

This is a division of U.S. patent application Ser. No. 09/341,629, filed on Jul. 15, 1999, now U.S. Pat. No. 6,514,477, issued on Feb. 4, 2003, that is a 371 of International Patent Application PCT/EP98/00211, filed on Jan. 15, 1998, that has priority benefit of Great Britain Patent Application 9700708.2, filed on Jan. 15, 1997.

The present invention relates to a thermally stable fire retardant laminate for printed circuit boards using a thermally stable aluminium hydroxide without the need for other fire retardant agents.

Printed circuit board laminate types are defined by the American NEMA (National Electrical Manufacturers Association) standard, the terminology is accepted world-wide. Generally, laminates are categorized according to the type of reinforcement used, i.e., cellulose paper or glass. Typically, the type FR-2 uses paper only, CEM-1 uses paper and woven glass, while type CEM-3 contains both woven and non-woven glass. The type FR-4 contains woven glass only.

To achieve the required V0 level of fire retardancy according to American Underwriters Laboratories' standard UL-94, it is necessary to add either fire retardant chemicals to the polymer system or build halogens or phosphorous into the backbone of the polymer itself. On combustion, these additives help to extinguish the fire. However, in the process of doing so they produce toxic and corrosive gases. In the case of combustion of FR-2 laminates, which contain phosphorous compounds, phosphoric acid is formed. CEM-1, CEM-3 and FR-4 laminates which contain brominated epoxy resin, produce corrosive and toxic hydrogen bromide on combustion.

It is well known in the art that aluminium hydroxide may be used to improve the fire retardancy of synthetic polymer systems based on for example epoxy, polyester, and vinyl ester because the polymers decompose in the same temperature range as the aluminium hydroxide. However, the thermal stability of the gibbsite form of aluminium hydroxide $(Al(OH)_3$ or sometimes represented as $Al_2O_3$ $3H_2O)$ is insufficient at the temperatures used to solder components to a printed circuit board laminate. This can result in blistering of the laminate thereby rendering it unusable.

It is known that when gibbsite type aluminium hydroxide is heat treated in air it is partially converted to the mono hydrate form, boehmite (AlOOH or $Al_2O_3$ $H_2O$) which improves thermal stability but to the detriment of fire retardancy.

Japanese patent disclosure JP-A 60/203 438 describes a CEM-3 laminate containing heat treated gibbsite type aluminium hydroxide which has improved thermal stability over standard aluminium trihydroxide but which does not give the required level of fire retardancy so that brominated epoxy resin has to be used to achieve the UL 94 V0 rating. In such circumstances, and in the absence of superior fire properties, other inorganic materials such as talc or clay could also be used.

The object of the present invention is to produce a CEM-3 laminate which has good thermal stability, is halogen/phosphorous free and meets the UL 94 V0 requirement. A further object of the invention is to develop a thermally stable aluminium hydroxide which impart the required characteristics to the laminate.

It was possible to achieve the object of the invention by means of a laminate for printed circuit boards according to the invention, by a method for the preparation of the laminate according to the invention, by a printed circuit board made of the laminate according to the invention, and by a thermally stable aluminum hydroxide according to the invention.

The CEM-3 type laminates are as a rule constructed from two layers of woven fiberglass on the outsides and three layers of non-woven glass tissue in the core. According to the invention, the laminate for printed circuit boards has surface layers comprising curable resin-impregnated woven glass fabric and intermediate layers comprising curable resin-impregnated non-woven glass, and is characterized in that the intermediate layers contain 200% by weight to 275% by weight (based on the resin) of a thermally stable aluminum hydroxide of the molecular formula $A_2O_3.nH_2O$ wherein $2.6<n<2.9$.

The curable resin may be an unsaturated polyester resin, an epoxy, a vinyl ester or any suitable thermosetting compound which on combustion decomposes in the same temperature range as the thermally stable aluminium hydroxide.

The laminates may be based on epoxy resin which allows a batch process to be used. The laminates may also be produced by continuous process using unsaturated polyester or vinyl ester, i.e., resins which polymerize via a free radical mechanism. The nature of the invention however does not limit the manufacturing technique for the laminate.

When the production of the laminate is based on epoxy resin, as a rule two layers of woven glass preimpregnated with the epoxy resin are combined with three layers of non-woven glass preimpregnated with epoxy resin containing thermally stable aluminium hydroxide. These five layers are usually then combined with one or two layers of copper foil on the outside and the assembly subjected to heat and pressure to polymerize the resin and consolidate the laminate.

Most epoxy resins used for electrical and electronic applications are derived from bisphenol A or cycloaliphatic species. The most common curing agent is dicyandiamide.

According to the method of the present invention, the intermediate layer comprising curable resin impregnated non-woven glass contain 200% by weight to 275% by weight, preferably 225% by weight to 250% by weight, of the thermally stable aluminium hydroxide relative to the weight of the curable resin.

In the molecular formula, $Al_2O_3$ $nH_2O$, n preferably has a value of 2.7 to 2.8.

A feature of the halogen and phosphorous free epoxy laminate of the present invention is the use of thermally stable aluminium hydroxide as the sole fire retardant.

The prior art describes the removal of a part of the water content of aluminium hydroxide as a means of improving it's thermal stability. If insufficient water is removed, the laminate containing the aluminium hydroxide does not survive the soldering operation. However, a limitation of the prior art is that if too much water is removed the resulting aluminium hydroxide may contain too little water of constitution to act effectively as a fire retardant.

A further complication is the formation of the more thermally stable phase aluminium hydroxide (boehmite), which not only contains one third of the amount of water as the original aluminium trihydroxide (gibbsite) it also holds it back to 520° C. before releasing it. This detracts further from fire retardant effectiveness.

It is well known in the art that the finer is the aluminium hydroxide starting material, the less is the tendency to form the undesirable boehmite phase on heating. However, at the particle sizes necessary to avoid boehmite formation (>1 μm), it becomes virtually impossible to process the material in synthetic resin. On the other hand, thermally stable aluminium hydroxide which is processable will contain too much boehmite thus preventing the production of a halogen-free epoxy laminate which passes UL94 V0.

Essentially, the novel feature of the thermally stable aluminium hydroxide of the present invention is the surprisingly low boehmite content relative to the average particle size. This allows lower values of n to be obtained thereby improving water stability without compromising on fire properties' effectiveness. Thus, for n<2.6, there is insufficient water (and too much boehmite) to achieve the required fire properties whereas for n>2.9, there is too much water still present to achieve the required thermal resistance to soldering.

The decoupling of the relationship between boehmite formation and particle size is achieved by suitable mechanical treatment of relatively coarse particles (average size ca 60 μm) of aluminium hydroxide prior to the thermal pretreatment step. A suitable mechanical treatment would be provided for example by the application of compressive forces to aluminium hydroxide to increase polycrystallinity. Without being bound to any particular theory, it appears that structural degradation by such means creates the conditions for a more easy diffusion of water to the exterior of the crystals thereby minimizing the tendency to build-up of hydrothermal pressure within the crystals and hence the reduced tendency to boehmite formation.

In practical terms, the product of the invention can be created by a size reduction of an aluminium hydroxide agglomerate with an average particle size D50% of 40 to 80 μm, preferably of 50 to 70 μm, crystallized out from a typical Bayer process—sodium aluminate solution.

Any size reduction technique, e.g. ball milling, which separates the crystals present within coarser agglomerates with little or no gross fracture of the single crystals can be applied. A simultaneous broadening of the particle size distribution due to attrition and the absence of crystal breakage by gross fracture improves the processability of the thermally stable aluminium hydroxide in the respective resin system.

The subsequent thermal stabilization can be achieved by simply heating the material recovered from the size reduction treatment at a temperature and during a time sufficient to reduce the water loss on ignition from 34.5 wt % (n=3) to a level corresponding to n value according to the invention.

The thermally stable aluminium hydroxide according to the present invention expediently has a specific surface area measured according to the BET method of from 2 to 10 $m^2/g$. A very essential point is the particle size distribution which combines a relatively fine average size with a breadth of particle sizes. This improves the dispersion of the thermally stable aluminium hydroxide in the resin while at the same time minimizing the tendency of the coarser particles to sediment out during processing and avoiding any filtering effects by the non-woven glass an optimum particle size distribution allow minimum viscosity of the resin/filler mix at a filling level sufficiently high to achieve the desired flame retardant properties of the laminate without the need to add any other flame retardants.

The average particle size of the thermally stable aluminium hydroxide of the present invention D50% is in the range 5 to 10 μm. The breadth of the particle size distribution is indicated by the D10% range, i.e., 10% by weight of the particles are smaller than 0.5 to 1.5 μm and the D90% range, i.e., 90% by weight of the particles are less than 20 to 35 μm in size.

The oil absorption measured according to standard method DIN 53199 is within the range 25 to 35 ml/100 g.

The incorporation of the thermally stable aluminium hydroxide into the curable resin can be accomplished by methods known to those skilled in the art, i.e., usually by introducing the filler into the predissolved mixture of resin and curing agent using suitable equipment such as shearing head mixer. If needed, other inorganic thermally stable fillers may be added to the formulation such as fine silica, clay or talc, although none of these would significantly enhance fire properties.

Further processing of the resin/filler mix to the "prepreg" stage and then to the cured laminate is common state of the art and described in the literature, an example of which is "Handbook of Epoxide Resins", published by the McGraw-Hill Book Company.

The cured laminate according to the present invention shows excellent thermal stability, when immersed in molter solder at 260° C., it shows no signs of blistering or bubbling for a period of over 90 seconds. The laminate also has excellent fire retardancy characteristics and meets the requirements of UL 94 V-0.

FIGURES

FIG. 1 shows the effect of heating aluminium hydroxides of different particle sizes (based on the measurement of the "loss on ignition, LOI") on the percent of boehmite (AlOOH) formed by X-ray diffraction.

Curves 1 to 3 designate standard aluminium hydroxides (Martinal® ON-types of Martinswerk GmbH, Bergheim, Germany) with the particle sizes 60 μm (ON, curve 1), 10 μm (ON-310, curve 2) and 1.5 μm (OL-104, curve 3) in comparison with the thermally stable aluminium hydroxide of the invention (curve 4).

Figure 2:
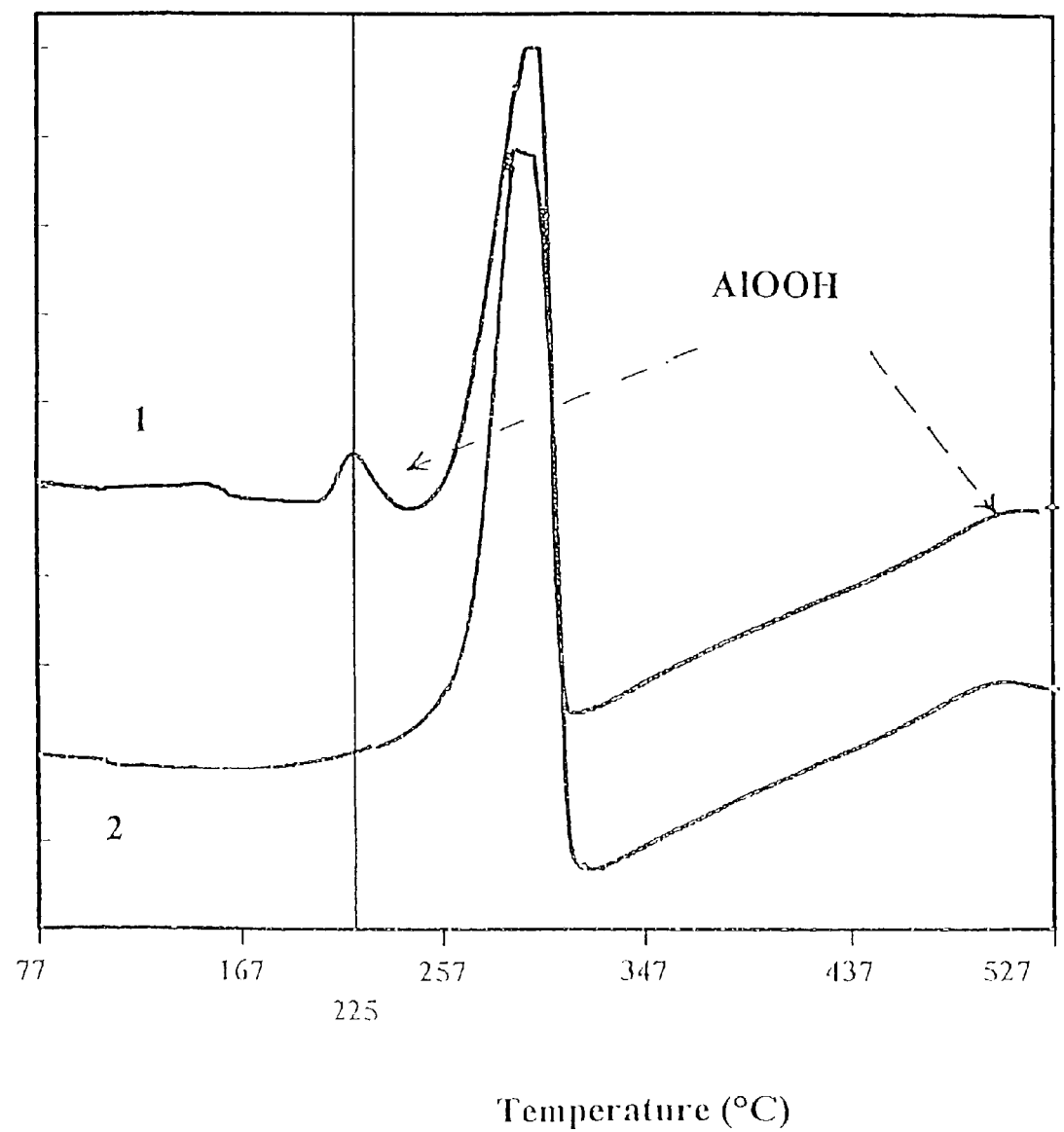

FIG. 2 shows differential scanning calorimetry of the thermally stable aluminum hydroxide of the invention (curve 2) in comparison with a standard aluminum hydroxide (curve 1), (Martinal® ON-310 of Martinswerk GmbH, Bergheim, Germany).

EXAMPLES

Fine crystals of aluminium hydroxide (average size 1–2 μm) are agglomerated to ca 60 μm average size by using a seed charge of 50 kg/dm³ sodium aluminate solution of following concentration $Na_2O$—140 kg/dm³, $Al_2O_3$—150 kg/dm³, total $Na_2O$—150 kg/dm³. The working capacity of the crystallizer was 1 m³. Crystallization temperature was 75° C. with a retention time of 24 h.

Alumina liquor productivity was ca 40 kg/dm³. The product of crystallization was washed with deionized water and dried at 105° C. for 4 h.

Size reduction of the aluminium hydroxide particles was effected by means of a vibration mill (type Palla 200 of the KHD company). The milling conditions were as follows motor—1000 rpm, loading of cylpebs—ca 65% by volume, cylpebs dimensions—12 mm×12 mm aluminium oxide, mill throughput ca 50 kg/h. Under these conditions, the feed aluminium hydroxide was reduced in size to the dimensions given in Table 1.

The final step of thermal stabilization was achieved by lowering the water loss on ignition from the 34.5 wt % of the size reduced material to ca 31 wt % by heating in an electric oven operating at a temperature of 220° C. for a time of ca 2 h. The properties of the thermally stable material are also given in Table 1.

The physical properties of the aluminium hydroxide according to the present invention are shown in comparison to a standard aluminium hydroxide of Martinswerk GmbH, Bergheim, Germany and heat treated aluminium hydroxide of the prior art as described in JP-A 60/203 438.

Table 1

Characteristics of the thermally stable aluminium hydroxide in comparison with standard aluminium hydroxide (Martinal® ON-310, Martinswerk GmbH, Bergheim, Germany) and thermally stable aluminium hydroxide of the prior art (JP-A 60/203 438).

| Physical Parameter | Aluminium Hydroxide of the Invention | Standard Aluminium Hydroxide | Aluminium Hydroxide of the prior art |
|---|---|---|---|
| $Al_2O_3.nH_2O$ "n" | 2.7 | 3.0 | 2.4 |
| Particle size D10% (μm) | 1.0 | 2.0 | 0.6 |
| Particle size D50% (μm) | 7.5 | 10.0 | 1.0 |
| Particle size D90% (μm) | 28.0 | 20.0 | 1.8 |
| Specific Surface Area $m^2/g$ | 6.0 | 2.5 | 50.0 |
| Oil Absorption (m/l 100 g) | 28.0 | 27 | 33.0 |

Differential scanning calorimetry shows the virtual absence of any endotherm due to boehmite compared to the standard aluminium hydroxide as represented by Martinal® ON-310 (see FIG. 2).

Batch Process 100 parts of an epoxy resin with epoxy equivalent of 400–500 (DOW DER 652) dissolved in 30 parts of acetone is mixed with 4 parts of dicyandiamide predissolved in 36 parts of 2-methoxy ethanol. To this mix is added 0.1 parts of 2-methyl imidazole to accelerate the resin cure (Mix A).

Woven glass fabric (style 7628 manufactured by Interglass) is impregnated with the Mix A to a resin content of 42%, and the resin B-staged for 2 min at 160° C. to produce a dry prepreg.

Separately, to Mix A is added 250 phr (i.e., parts per hundred resin) of the different types of aluminium hydroxide shown in Table 2. Each of these mixes are impregnated into non-woven glass (type E 105 manufactured by Owens Corning) to give weight corresponding to 90% of the total. The aluminium hydroxides are predispersed in an amount of acetone commensurate with achieving the final mix viscosity. The resin system is then B-staged for 3 min at 160° C. to produce a dry, handlable prepreg.

Three of the non-woven glass prepreg layers are sandwiched between two woven glass prepreg layers. This assembly has copper foil placed on both sides and the pack laminated at 180° C. at a pressure of 50 bar for 90 min to produce a copper clad laminate 1.6 mm thick.

Continuous Process

In the above example, the epoxy resin may be replaced by resin systems which cure by a free radical polymerization reaction thereby leading to a negligible level of volatile emissions. Examples of these are unsaturated polyester, epoxy acrylate or vinyl ester resins.

In the continuous process, the woven glass cloth (style 7628, Interglass) is impregnated continuously through, e.g., a liquid vinyl ester resin (DOW Derakane) containing 100 parts by weight of resin and 1.5 parts of benzoyl peroxide. Separately, the non-woven glass is impregnated continuously through vinyl ester/benzoyl peroxide mix containing 250 phr of the aluminium hydroxide of the present invention.

After initial curing in a tunnel oven for 10 min at 120° C., the layers are combined with two layers of copper foil on the outside and the seven layers consolidated under heat and pressure in a conveyorised moving platform for 15 min at 150° C. The continuous laminate so produced has a thickness of 1.6 mm.

TEST RESULTS

The thermal stability and fire retardant properties of the laminates produced by these techniques are dependent on the properties and level of the aluminium hydroxide, not on the polymer nor laminate manufacturing technique.

In Table 2 are given the results obtained when using non-halogenated epoxy resin. These should be taken as typical and representative of all of the polymer types described.

Comparison is made between the thermally stable aluminium hydroxide of the invention and the standard aluminium hydroxide (Martinal® ON-310 of Martinswerk GmbH, Bergheim, Germany) and thermally stable aluminium hydroxide of the state of the art (JP-A 60/203 438).

Solder resistance is measured by fully immersing the laminate in molten solder at 260° C. When the aluminium hydroxide starts to decompose it is possible to hear the laminate blistering and the escaping water causes "waves" at the solder surface. The time is measured until the blistering/waves are detected.

The flammability is defined by the American Underwriters Laboratory UL 94 standard which categorizes performance on combustion as V-0 (the best), V-1 and HB (the worst). For pcb applications laminates have to meet the V-0 category.

TABLE 2

Solder Resistance and Flammability Test Results

| Test | Laminate with Aluminium Hydroxide of the Invention | Laminate with Standard Aluminium Hydroxide | Laminate with Aluminium Hydroxide of the Prior Art | |
|---|---|---|---|---|
| value of "n" | 2.7 | 3.0 | 2.9 | 2.4 |
| Aluminium Hydroxide | 250 phr | 250 phr | 250 phr | 250 phr |
| Solder Resistance | >90 s | 20 s | 20 s | >90 s |
| Flammable UL 94 | V0 | V0 | V0 | HB |

The invention claimed is:

1. A laminate for printed circuit boards having surface layers comprising curable resin impregnated woven glass fabric and intermediate layers comprising curable resin impregnated non-woven glass, the intermediate layers contain 200 percent by weight to 275 percent by weight, based on the resin in the intermediate layers, of a thermally stable aluminum hydroxide of the molecular formula $Al_2O_3.nH_2O$, wherein n has a value of 2.6<n<2.9, and the aluminum hydroxide has a specific surface area, measured by the BET method, of 2 to 10 $m^2/g$ and a particle size in the D50% range of 5 to 10 μm.

2. The laminate according to claim 1, wherein the thermally stable aluminum hydroxide has a particle size in the D10% range of 0.5 to 1.5 μm and in the D90% range 20 to 35 μm.

3. The laminate according to claim 2, wherein the thermally stable aluminum hydroxide has an oil absorption of 25 to 35 ml/100 g.

4. The laminate according to claim 3, wherein the curable resin is an unsaturated polyester resin, an epoxy resin or a vinyl ester resin.

5. The laminate according to claim 1, wherein the thermally stable aluminum hydroxide has an oil absorption of 25 to 35 ml/100 g.

6. The laminate according to claim 1, wherein the curable resin is an unsaturated polyester resin, an epoxy resin or a vinyl ester resin.

7. The laminate according to claim 1, wherein the epoxy resin is derived from bisphenol A or a cycloaliphatic epoxy.

8. The laminate according to claim 1, wherein the curable resin is a thermosetting compound that on a combustion decomposes in the same temperature range as the thermally stable aluminum hydroxide.

9. The laminate according to claim 1, wherein there are two surface layers and three intermediate layers.

10. The laminate according to claim 9, wherein a layer of copper foil is located on one or both of the surface layers.

11. The laminate according to claim 1, wherein the intermediate layers contain 225 percent by weight to 250 percent by weight of the thermally stable aluminum hydroxide relative to the weight of the curable resin.

* * * * *